U S 0 0 5 8 4 1 2 5 5 A

United States Patent [19]

Canada et al.

[11] Patent Number: 5,841,255

[45] Date of Patent: Nov. 24, 1998

[54] FLUX DETECTOR SYSTEM

[75] Inventors: Ronald G. Canada, Knoxville; Eugene F. Pardue, Lenoir City; James C. Robinson, Knoxville, all of Tenn.

[73] Assignee: CSI Technology, Inc., Wilmington, Del.

[21] Appl. No.: 13,011

[22] Filed: Jan. 26, 1998

Related U.S. Application Data

[63] Continuation-in-part of Ser. No. 915,069, Aug. 20, 1997, which is a continuation-in-part of Ser. No. 697,335, Aug. 22, 1996, Pat. No. 5,726,911.

[51] Int. Cl.$^6$ .................................................. G01R 31/02
[52] U.S. Cl. ...................... 318/490; 318/565; 318/647; 388/903; 324/219; 324/260; 324/529; 73/514.16
[58] Field of Search .................................. 318/490, 565, 318/647; 388/903; 324/219, 260, 529; 361/23; 73/514.16

[56] References Cited

U.S. PATENT DOCUMENTS

| 4,194,178 | 3/1980 | Dumbeck | 340/201 R |
|---|---|---|---|
| 4,258,421 | 3/1981 | Juhasz et al. | 364/424 |
| 4,339,875 | 7/1982 | Muller | 29/602 |
| 4,377,784 | 3/1983 | Saito et al. | 318/490 X |
| 4,495,448 | 1/1985 | Dumbeck | 318/54 |
| 4,525,763 | 6/1985 | Hardy et al. | 361/24 |
| 4,575,803 | 3/1986 | Moore | 364/551 |
| 4,659,976 | 4/1987 | Johanson | 318/332 |
| 4,761,703 | 8/1988 | Kliman et al. | 361/23 |
| 4,823,067 | 4/1989 | Weber | 318/799 |
| 4,839,830 | 6/1989 | Amey et al. | 364/551.01 |
| 4,893,073 | 1/1990 | McDonald et al. | 324/117 H |
| 5,019,760 | 5/1991 | Chu et al. | 318/490 |
| 5,189,350 | 2/1993 | Mallett | 318/434 |
| 5,450,321 | 9/1995 | Crane | 364/424.04 |
| 5,473,229 | 12/1995 | Archer et al. | 318/254 |
| 5,554,900 | 9/1996 | Pop, Sr. | 310/156 |

*Primary Examiner*—Bentsu Ro
*Attorney, Agent, or Firm*—Luedeka, Neely & Graham, P.C.

[57] ABSTRACT

An ac machine monitor, particularly applicable to ac induction motors, provides information for ascertaining the health and condition of the motor. The monitor is self-contained, having its own internal power source, electronics, and sensor suite, and attaches directly to the outer frame of the motor. Sensors disposed within the monitor include a motor frame temperature sensor, flux sensor, vibration sensor, and clock. The flux sensor includes a substantially planar substrate onto which a conductive trace is attached as the flux sensing element. Sensor outputs are processed and analyzed by monitor electronics to determine various life history parameters, including motor speed and load, which are stored in electronic memory. A communications port enables a peripheral device, such as a notebook computer or portable data collector, to communicate with the monitor and download the life history parameters stored in memory. Downloaded data can be further analyzed and statistically compared to trend data at a base computer to ascertain the health and condition of the motor. The monitor electronics are configured to consume very little power so that the internal power source will continue to power the monitor for several years.

17 Claims, 12 Drawing Sheets

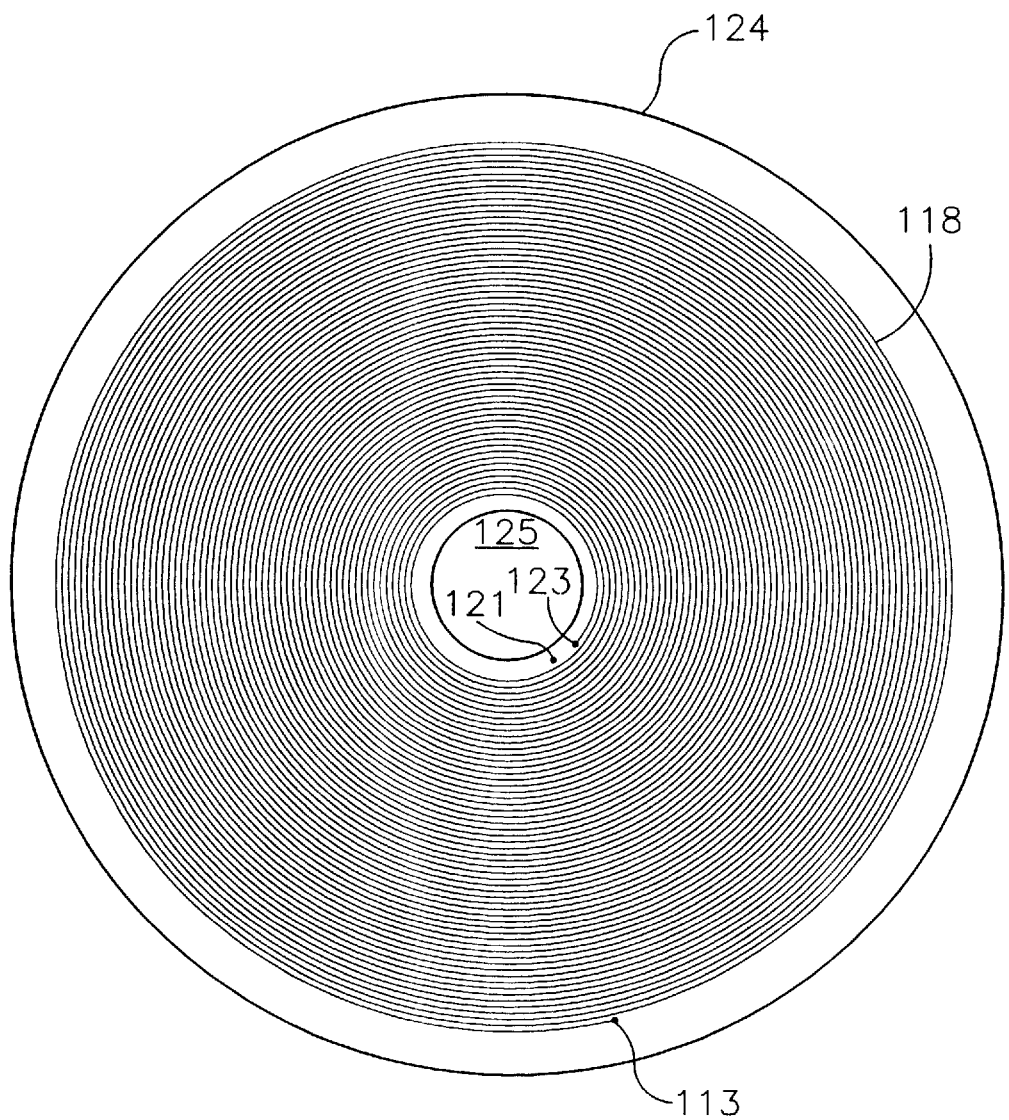
_Fig._ 14
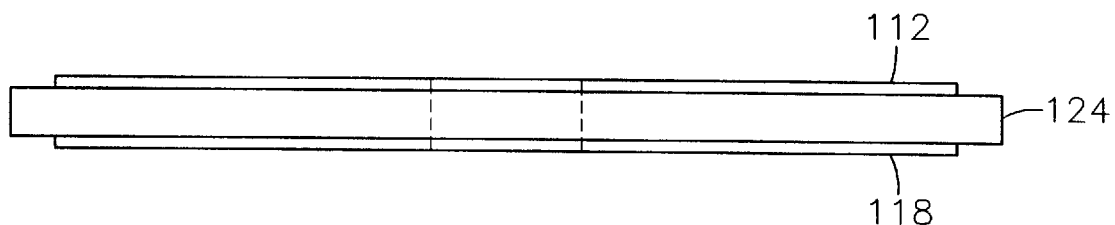
_Fig._ 15

FLUX DETECTOR SYSTEM

This is a continuation-in-part of pending application Ser. No. 08/915,069, filed Aug. 20, 1997, which is a continuation-in-part of application Ser. No. 08/697,335, filed Aug. 22, 1996, now U.S. Pat. No. 5,726,911.

TECHNICAL FIELD

The present invention relates to a system for monitoring flux generated by electric machines. More particularly, it relates to a self-contained flux detector which attaches to an electric motor to detect and process flux and to record flux and various flux-derived operating parameters during the life of the motor so that the condition of the motor is always known.

BACKGROUND

In typical industrial and manufacturing facilities, various types of machinery are employed at various stages of the production process. Such machines generally function to provide the power and moving forces necessary to achieve the end product or process. From a production viewpoint, it is desirable to maintain the machinery in good operating condition to avoid unproductive downtime and profit loss when a machine experiences a failure condition. Therefore, a typical plant maintenance program will involve activities for monitoring the operating condition of plant machinery so that the health and condition of the machines can be maintained at high levels to reduce the number of unexpected machine failures.

Portable instruments are often employed to periodically monitor various operating conditions of industrial machinery. These portable instruments, which are often referred to as data collectors or data analyzers, typically include a vibration transducer attached to what is essentially a hand-held computer. The maintenance technician places the vibration transducer against a predefined test point of the machine. The resultant machine vibration signal produced by the transducer is provided to the data collector where the data is processed and stored for later downloading to a host computer. The host computer then analyzes the vibration data for faults or other anomalous conditions.

Machines within a facility are typically monitored according to a route which is programmed into the data collector by the host computer. The route will typically include a list of machines, test points, and a set-up condition for each test point. There may be as many as thirty or more machines in the route with ten test points on each machine, and for each test point there may be specified a vibration frequency range to be analyzed, a type of analysis to be performed, a particular type or set of data to be stored, and similar other parameters. In response to commands from the user, the hand held instrument prompts the user for the identity of the machine and the test point to be monitored, and it automatically sets up the instrument, for example, to accept the specified frequency range for the test point, perform the specified analysis and store the specified type or set of data. A Fast Fourier Transform analysis may be performed on a pre-selected frequency range of the data and all or part of the resulting frequency spectrum may be stored and displayed. As the user progresses through the thirty machines and the corresponding 300 test points, he collects and stores vibration data which is subsequently transferred to the host computer for long term storage and further analysis.

The present invention provides a completely new approach to machine monitoring. Instead of manually collecting machine data with a portable device of the type described above, this invention contemplates a machine monitor which is attached directly to the machine. The monitor includes the electronics and sensors necessary to sense, analyze, and store one or more of the machine's operating characteristics, including vibration, temperature, and flux. Since the monitor and the machine to which it is attached are often located in harsh industrial environments, the monitor's electronics and sensors must be adequately protected from mechanical shock, thermal shock, moisture, oil, dirt, and other environmental elements in order to function reliably over extended periods of time. Moreover, maintenance considerations for such machine monitors dictate that the monitor should be easy to install and replace, and that the monitor's electronics, sensors, and batteries (when applicable) be easily accessed. Provisions should also be incorporated into the monitor to enable maintenance personnel to easily download machine data stored by the monitor and to upload new programming to the monitor when needed.

To provide a machine monitor of the type herein described with flux sensing capability, traditional flux sensors can be used, but not without disadvantage. The dimensions and geometry of traditional flux sensors makes their integration into a machine monitor very difficult. For example, the size and arrangement of so-called "flux coils" which utilize a coil of wire approximately one foot in diameter—the type of sensor generally used for measuring flux produced by large industrial machines—makes their use in a machine monitor undesirable. Such flux coils are configured to be attached directly to the machine and would require substantial modifications to be useful in a machine monitor. Smaller flux sensors capable of being mounted directly onto a circuit board are available, but their small size generally reduces their sensitivity. Also, requiring the sensor to be mounted to a circuit board limits the ability to position the sensor for maximum flux detection within the monitor.

What is needed, therefore, is a flux detector and flux detection system which is easily integrated with a machine monitor. The detector should be capable of being configured and positioned within the monitor for maximum flux detection.

SUMMARY

The above disadvantages in machine flux detection are overcome by a flux detection system for monitoring flux generated by an electric machine. The system includes a structural enclosure attached to a machine. A power supply provides electric power to the system. Disposed within the enclosure is a flux board for sensing flux generated by the machine. Flux signals produced by the flux board are received and processed by a signal processor disposed in the enclosure to produce machine operating parameters. The operating parameters are stored in a memory device disposed in the enclosure. The system also includes a communications port, such as an infrared data port, which is used to send and receive communications to and from a peripheral device.

In one embodiment of the flux board, the board includes a nonconductive, substantially planar substrate having opposed first and second surfaces. The flux sensing element is an electrically conductive trace, such as tin-plated copper, positioned adjacent the first surface of the substrate. Flux generated by the machine is detected by the trace, thereby producing the flux signal. The trace may be positioned on only one surface with the trace being in a plane which is substantially parallel with the first surface, but preferably the trace is positioned on both surfaces of the flux board.

The enclosure may be fabricated from two structural members having opposed closed and open ends which are secured to one another at the open ends. The two structural can be secured to each other by a variety of means, including clamps, slot and daggar interlock, and an adhesive. To inhibit the intrusion of moisture and other contaminants into the enclosure, a gasket is positioned at the interface between the two structural members.

The invention also provides a flux detector for sensing flux generated by an electric machine. The detector includes a nonconductive substrate having opposed first and second surfaces. The first and second surfaces are substantially flat and substantially parallel to each other. The substrate includes a through opening originating at the first surface and traversing the width of the substrate to the second surface. Flux generated by the machine is sensed by an electrically conductive trace adjacent to at least the first surface. The conductive trace is configured as a substantially repetitive geometric pattern positioned in a plane which is substantially parallel to the first surface.

BRIEF DESCRIPTION OF THE DRAWINGS

The above and other features, aspects and advantages of the present invention conjunction with the accompanying drawings in which:

FIG. 14 is a bottom view of a flux board having metal traces on both sides of the board; and FIG. 15 is a side view of the flux board of FIG. 14.

DETAILED DESCRIPTION OF PREFERRED EMBODIMENTS

Figure 1:
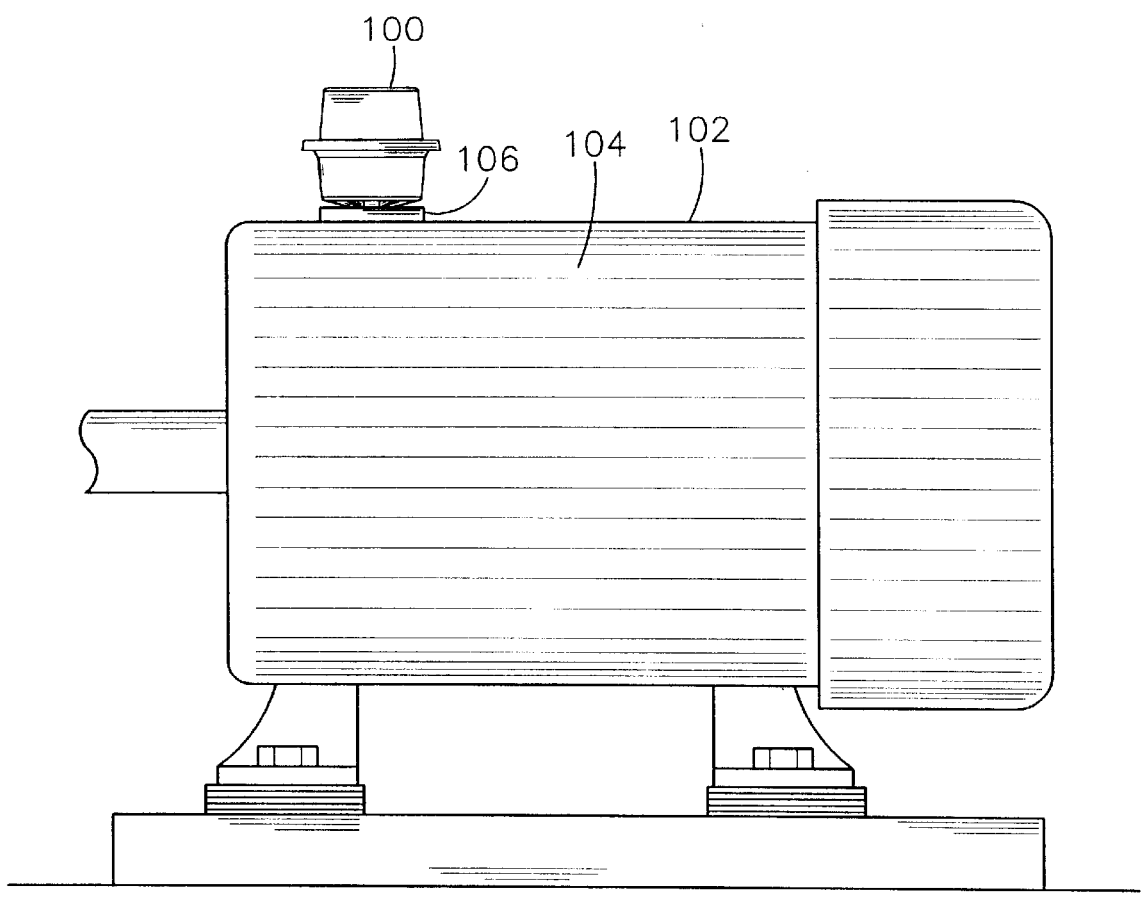
FIG. 1 is a side view of an ac induction motor with a monitor of the present invention attached to the motor by means of a mounting plate.

With reference now to the drawings in which like reference characters designate like or similar parts throughout the several views, FIG. 1 illustrates a machine monitor 100 capable of sensing, analyzing, storing, and outputting various machine operating data. The monitor of FIG. 1 is attached externally to the frame 104 of a large industrial electrical machine, such as an ac induction motor 102. However, it will be understood that the present invention may be used to monitor the operating status of any machine which produces vibration, temperature, and/or flux, including machines such as pumps, rolls, fans, and gearboxes. The monitor 100, which in a preferred embodiment is fully self-contained in sensors, data acquisition, and power, is small in comparison to the size of the motor 102 and mounted so as not to interfere with the operation of the motor 102. Although FIG. 1 illustrates a monitor 100 mounted at a particular location on the motor frame 104, it will be understood that the monitor 100 may be mounted at any location along the motor frame 104 where motor parameters, such as temperature, vibration, and flux, may be sensed.

Figure 2:
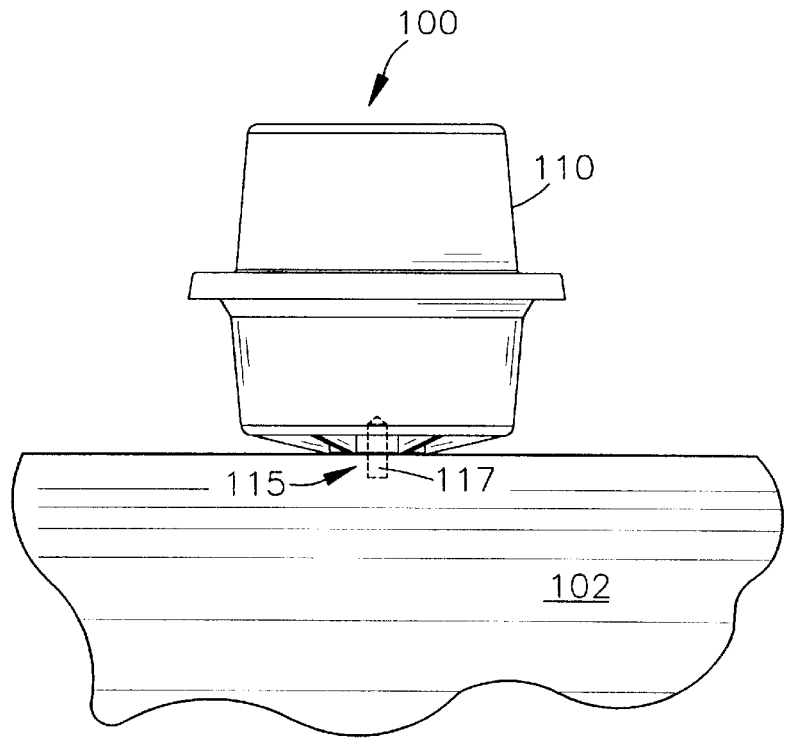
FIG. 2 is a sectional view of an electric motor monitor attached to an electric motor by means of a bolt threaded into the lifting eye bolt hole of the motor.

In order to provide consistent, reliable motor operating data, the monitor 100 should be capable of withstanding the environmental conditions typically experienced by an electric motor 102, including mechanical shock, thermal shock, and contamination from such materials as oil and water. As shown in FIG. 2, the monitor 100 consists of a ruggedized housing 110 capable of withstanding the typically harsh environments of industrial facilities. Electronics and sensors within the monitor 100 are sealed and protected by the housing 110 so that the monitor 100 may be mounted in exterior and wet environments.

Figure 3:
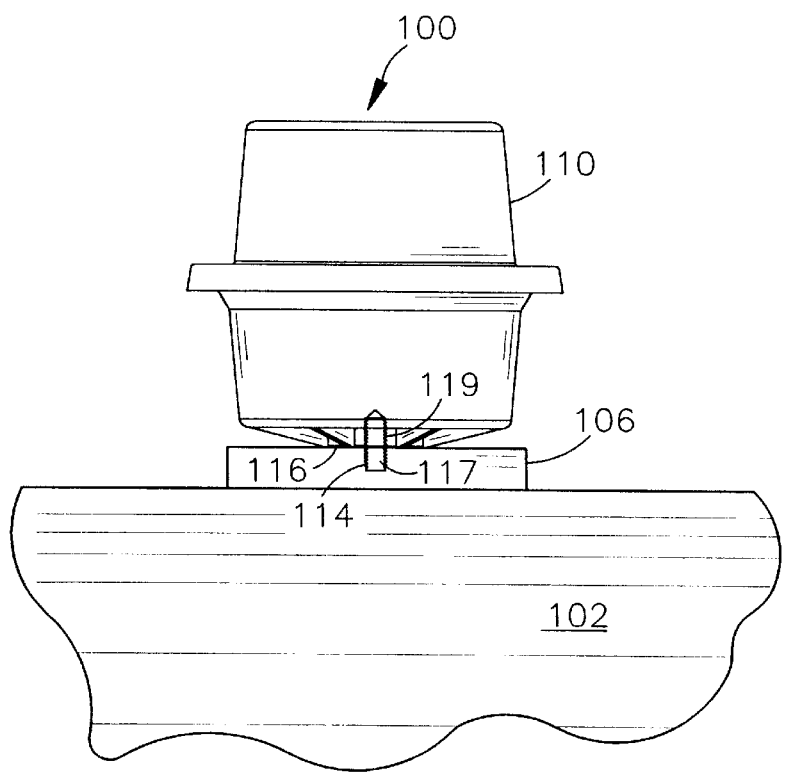
FIG. 3 is a sectional view of the motor monitor and mounting plate of FIG. 1.

Although the monitor 100 may be attached to the motor 102 by any suitable attachment means, including bolts, screws, rivets, quick release fasteners, welding, adhesives, and magnets, a preferred means of attaching the monitor 100 to the motor 102 is shown in FIG. 1. A mounting plate 106 is secured to the motor frame 104 preferably by use of an adhesive such as epoxy. Alternatively, the mounting plate 106 is attached to the frame 104 by bolts or other fastening means. As FIG. 3 illustrates, the mounting plate 106 includes a threaded recess 114 into which a threaded stud 117 is positioned. The stud 117 is of sufficient length to protrude above the plate 106 as shown. At the base of the monitor 100 is an engagement surface 116 which includes a threaded recess 119 sized to receive the stud 117. After mounting plate 106 is attached to the motor 102 and the stud 117 positioned within recess 114, the monitor 100 is then threaded onto that portion of stud 117 that protrudes above the mounting plate 106 so that the engagement surface 116 contacts the mounting plate 106, thereby enabling machine characteristics such as motor frame temperature and motor vibration to be readily communicated through the engagement surface 116 and into the monitor 100 where sensor are appropriately positioned to sense the machine characteristics. For example, sensors may be attached to the inner wall of the monitor 100, on circuit boards positioned within the monitor 100, or at any other position, so long as the positioning of the sensor enables it to sense a desired machine operating characteristic. Although machine characteristics may be communicated to the monitor 100 through the stud 117, it is believed that by attaching the monitor 100 in such a way that the engagement surface 116 establishes sensory contact with the mounting plate 106 or the motor frame 104, communication of machine characteristics into the monitor 100 is enhanced.

Referring again to FIG. 2, an alternate means of attaching the monitor 100 to the motor 102 is illustrated. The mounting plate 106 is eliminated in FIG. 2 and stud 117 is instead threaded into an existing motor lifting eye bolt hole, shown generally at 115. For the attachment methods illustrated in FIGS. 2 and 3, attachment of the monitor 100 to the motor 102 can be accomplished by hand. No tools are needed.

The monitor 100 may be conceptually viewed as a device that provides a function somewhat similar to the function provided by the odometer of an automobile. An automobile odometer provides the operator with information relating to how many total miles the vehicle has been driven. The mileage indicated by the odometer is used by the operator, and others, as a single measure of the general health and condition of the automobile. Preventive maintenance, component life, and even the worth of an automobile are usually established by this single parameter (i.e., mileage). Because of the complexity and interrelationship of factors that effect the condition of machines generally, and electric motors in particular, the health of an electric motor generally cannot be determined by a single parameter. For example, the following factors have been determined to affect the life of an electric motor:

1. Total run time (in hours);
2. Run time at various motor loading conditions;
3. Motor temperature;
4. Ambient temperature;
5. Number of starts and stops;
6. Motor vibration;
7. Balance and alignment of the motor;
8. Temperature history of the windings; and
9. Efficiency of the motor.

The monitor 100 of the present invention senses, collects, analyzes, and stores information useful for ascertaining the health and condition of electric motors based on these factors.

Depending on the type and amount of data that is desired, a single sensor or a plurality of sensors may be disposed in the monitor 100. In a preferred embodiment, the sensors which are employed to monitor the ac induction motor 102 of FIG. 1 include a motor frame temperature sensor 120, a magnetic flux sensor 124 for sensing motor flux, and a radial vibration transducer 126 for sensing motor vibrations generated by the motor 102 and transmitted through the motor frame 104. An ambient temperature sensor (not shown) can also be incorporated within the monitor 100 if desired.

For machines other than electric motors, the monitor 100 may be configured differently since the specific factors which affect the life of a machine may vary based on the type of machine that is being monitored. Although it is preferable to incorporate within the monitor 100 the capability to analyze sensor data, such as by fast Fourier transform (FFT), it is not required. If desired, the monitor 100 may be used simply as a device that senses and stores various operating characteristics with little or no analysis of the data performed within the monitor 100 itself. The stored sensor data could be downloaded to a base computer for analysis and archival.

Figure 4:
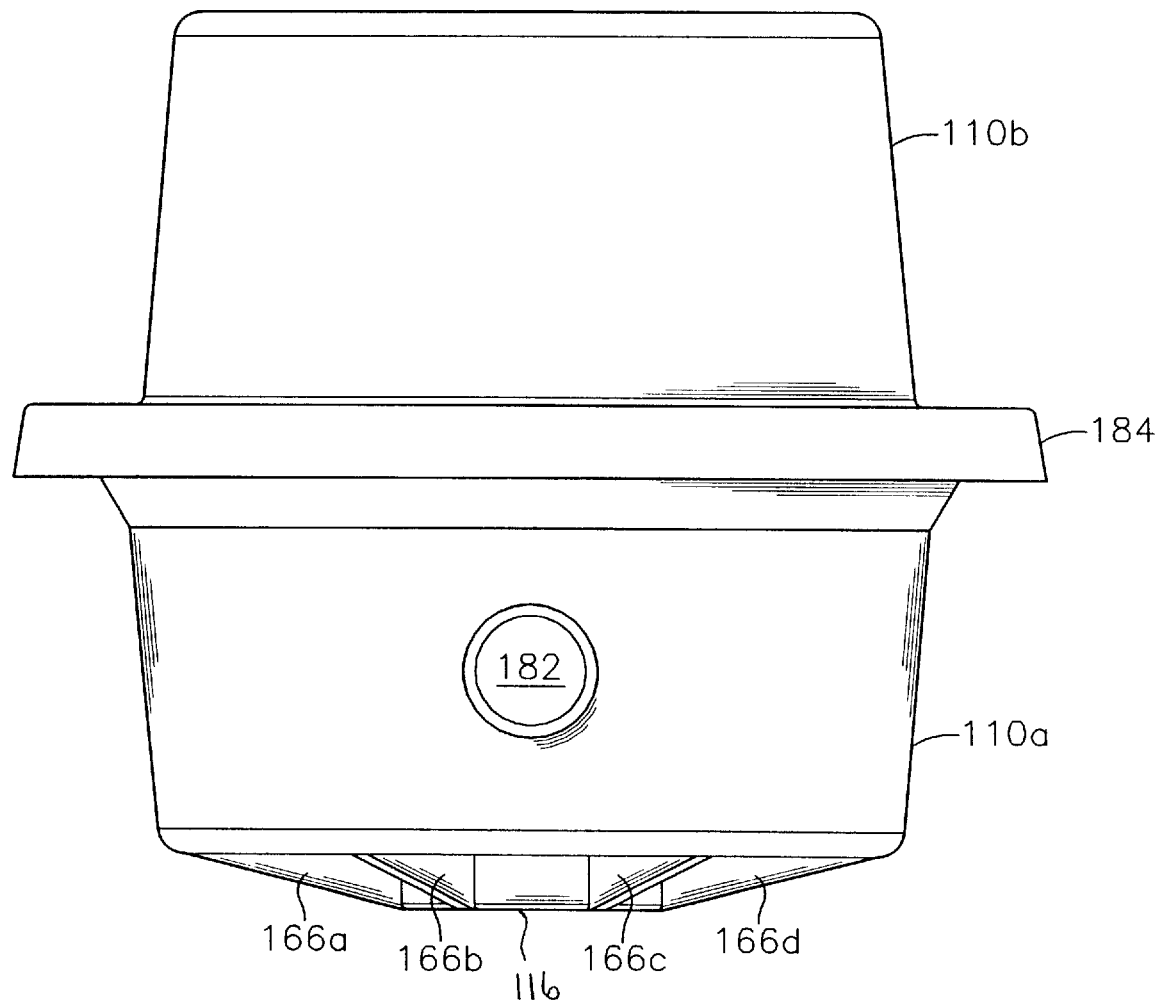
FIG. 4 is a side view of a monitor in accordance with the present invention showing the upper and lower housing.
Figure 5:
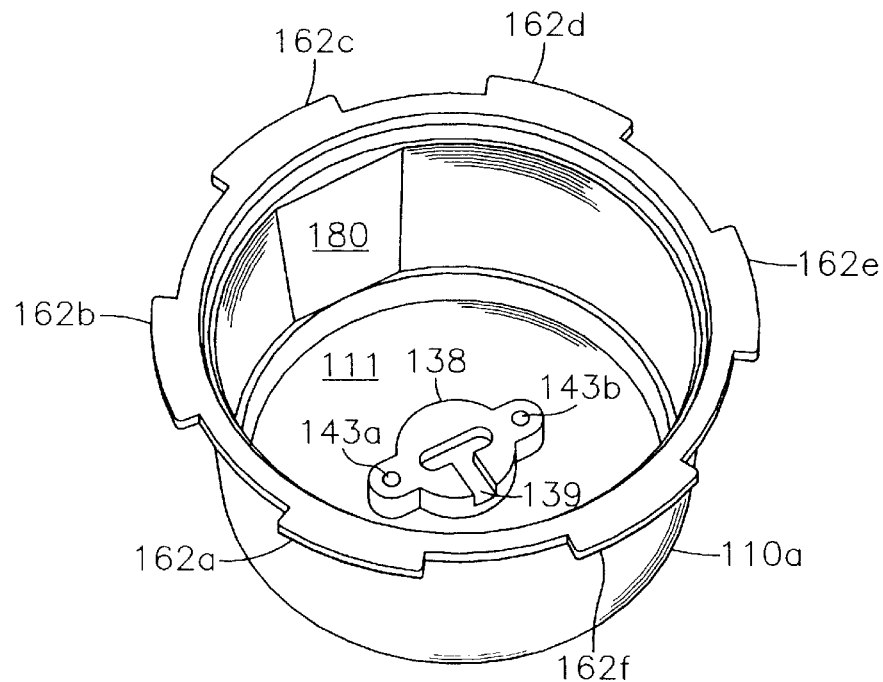
FIG. 5 is an elevational perspective view of the lower housing.
Figure 6:
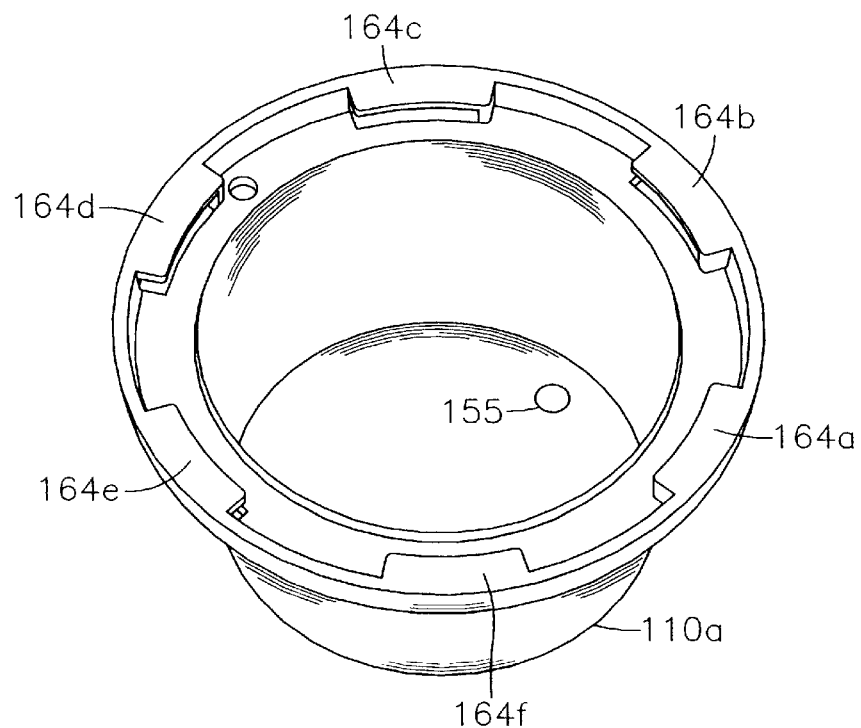
FIG. 6 is an elevational perspective view of the upper housing.
Figure 7:
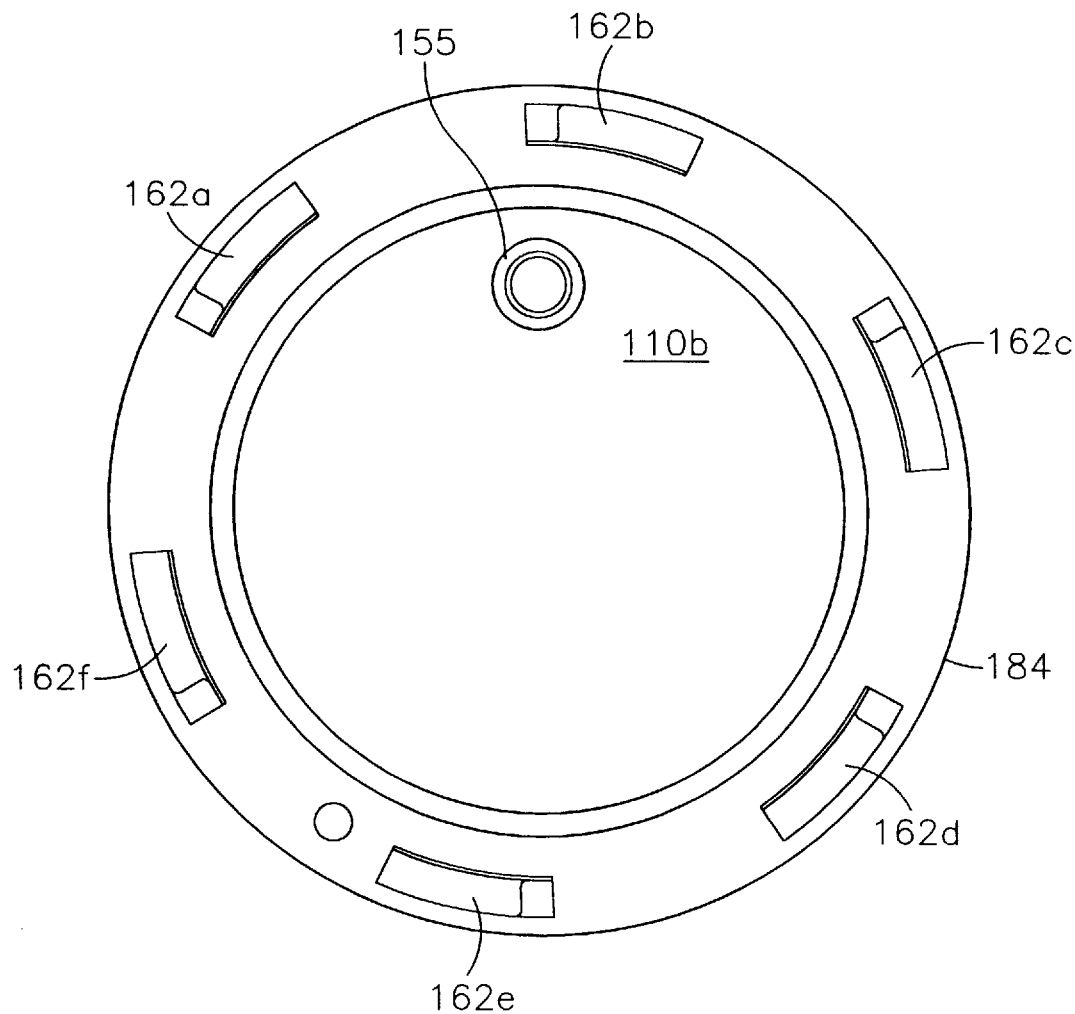
FIG. 7 is a top view of a monitor in accordance with the present invention.
Figure 8:
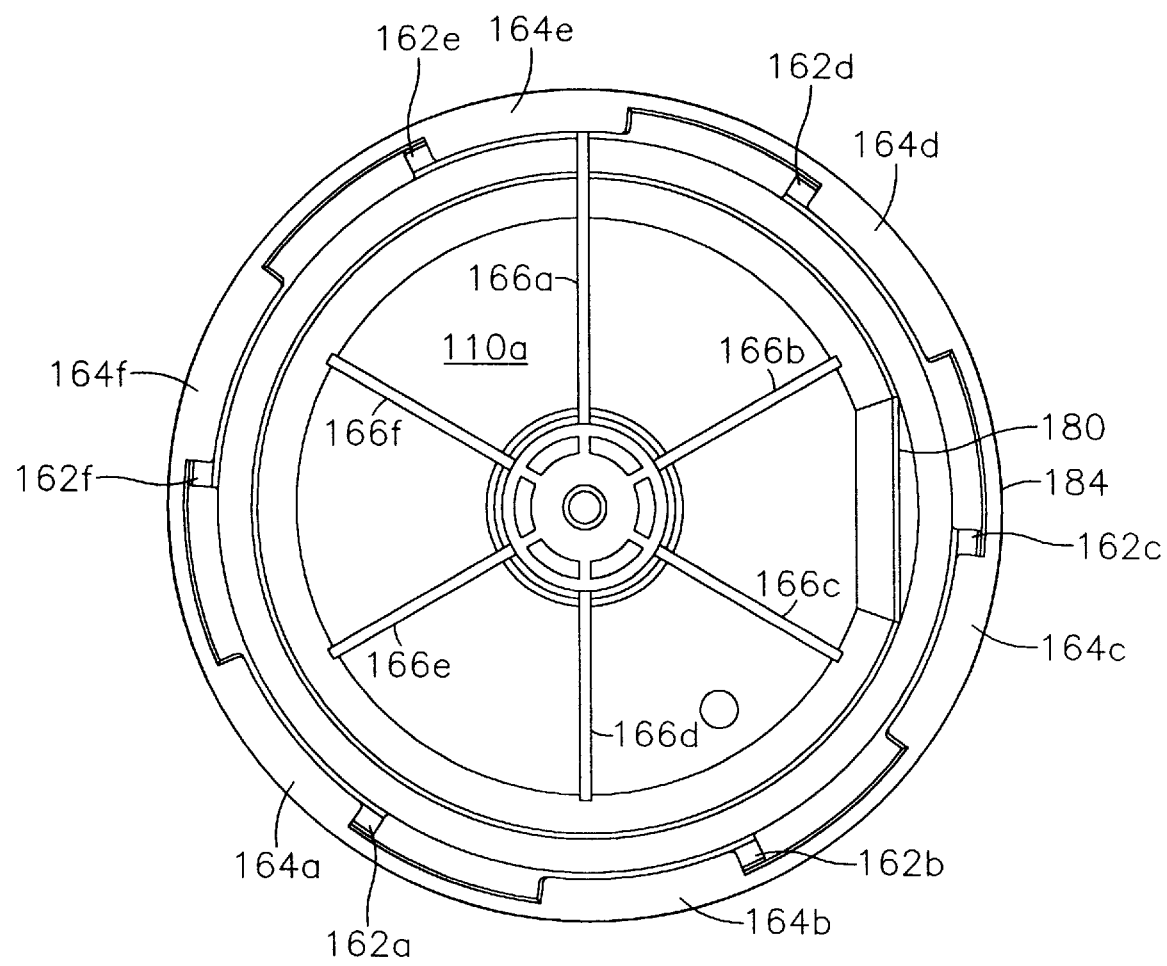
FIG. 8 is a bottom view of a monitor in accordance with the present invention.
Figure 9:
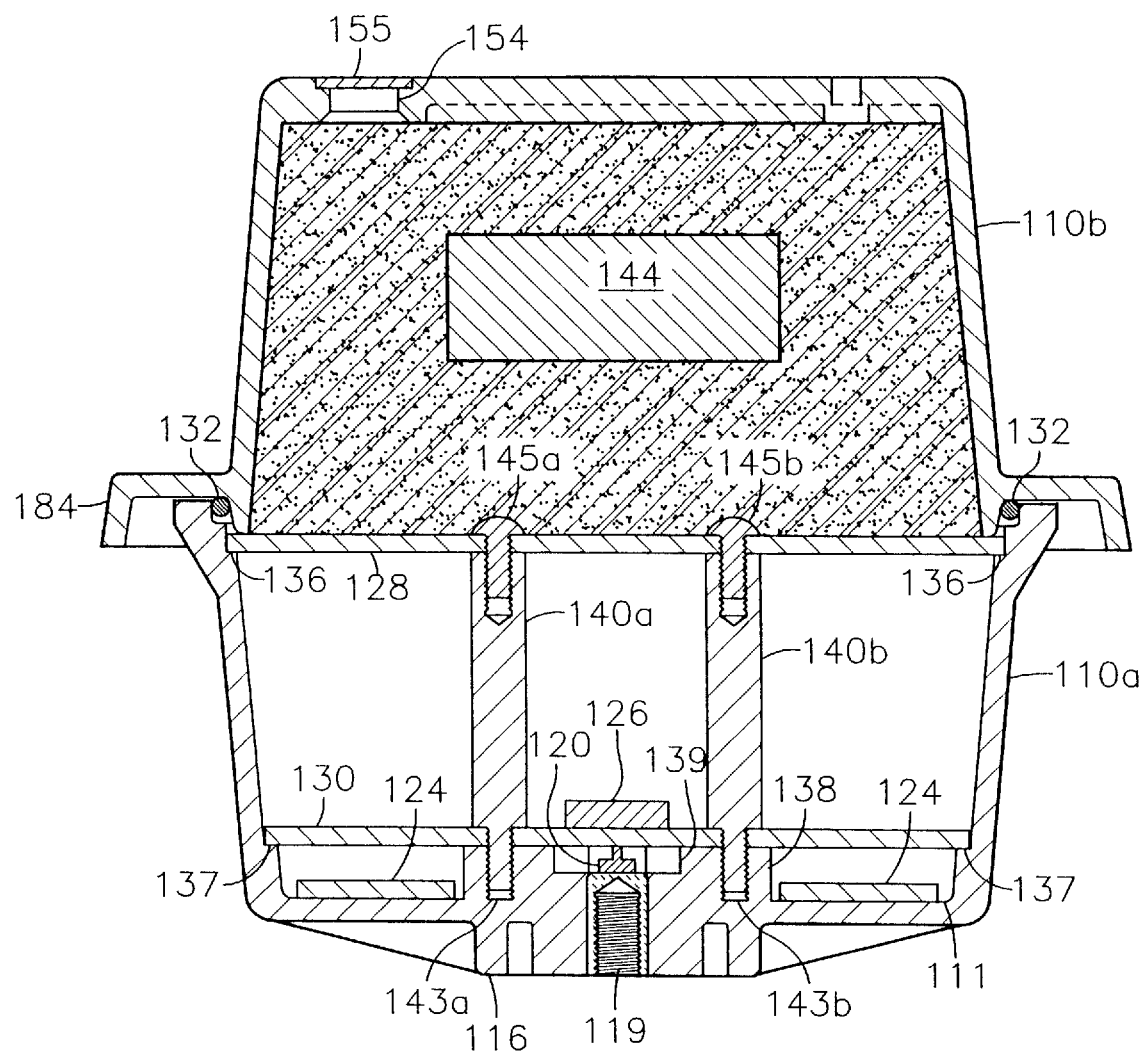
FIG. 9 is a cross-sectional view of a monitor utilizing two spacer rods to secure electronics boards within the monitor and showing a flux board adhesively secured to the bottom of the monitor.
Figure 10:
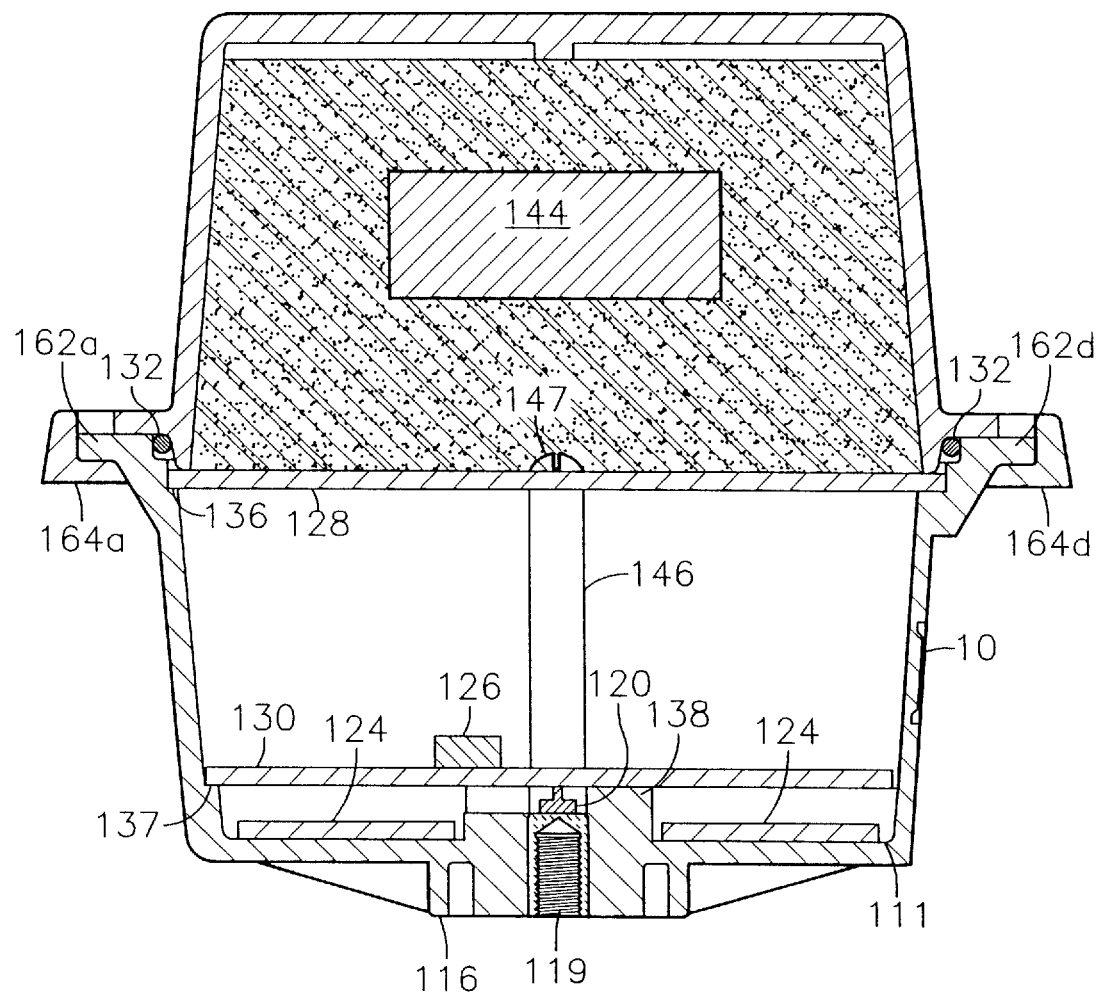
FIG. 10 is a cross-sectional view of a monitor utilizing a single spacer rod to secure electronics boards within the monitor and showing a flux board adhesively secured to the bottom of the monitor.

As best illustrated in the side view of FIG. 4, the perspective views of FIGS. 5 and 6, and the cross-sectional views of FIGS. 9 and 10, the housing 110 of the monitor 100 appears much like a small bucket with a lid as represented by a lower housing 110a covered by an upper housing 110b. Each of the lower and upper housings 110a, 110b are closed at one end and open at the other end so that when both open ends are joined, an enclosed space or chamber 131 is thereby formed. In a preferred embodiment as shown in FIGS. 5–10, the housings 110a, 110b are joined to each other by means of a plurality of tabs or daggers 162a–f which are equally spaced around the flanged open end of lower housing 110a. At the open end of the upper housing 110b is a flange 184 into which is formed a plurality of slots 164a–f. The number of slots 164a–f formed in the open end of the upper housing 110b is equal to the number of daggers 162a–f formed in the open end of the lower housing 110a. Additionally, the slots 164a–f are in spaced-apart relationship with the daggers 162a–f so that when the open ends of the housings 110a, 110b are positioned adjacent one another, movement of the upper housing 110b relative to the lower housing in a clockwise direction causes each of the daggers 162a–f to engage a corresponding one of the slots 164a–f, thereby attaching the two housings 110a, 110b and protecting the electronics and sensors within the chamber 131 from environmental elements such as mechanical shock, thermal shock, and foreign matter contamination. As shown in the cross-sectional views of FIGS. 9 and 10, protection of components within the chamber 131 is enhanced by the use of a resilient gasket 132 positioned within a channel formed in the open end of lower housing 110a. To separate the two housings 110a, 110b and gain access to the chamber 131, the upper housing 110b is rotated counterclockwise relative to the lower housing 110a, thereby disengaging the daggers 162a–f from the slots 164a–f.

Various alternative arrangements can be employed to join the two housings 110a, 110b. For example, the housings 110a, 110b may be secured to each other by one or more clamps (not shown) which hold the flanged open ends in compression. As another example, the upper housing 110b may be hinged and the hinged upper housing secured to the lower housing 110a by means of a latch. As yet another example, the two housings 110a, 110b may be simply glued together with an appropriate adhesive. In this embodiment, the adhesive functions both as a means for attaching the housings 110a, 110b and as a means for inhibiting intrusion of contaminants into the chamber 131. However, when the housings 110a, 110b are adhesively secured, the chamber 131 is significantly less accessible for maintenance purposes.

As can be seen in FIGS. 4, 9, and 10, the engagement surface 116 extends beyond the base of the lower housing 110a to elevate the monitor 100 and help reduce heating of the chamber 131 by the motor 102. In alignment with the engagement surface 116 is a pedestal 138 extending into the chamber 131 from a sensor surface 111 which is annularly positioned about the pedestal 138 and proximate to the motor 102 when the monitor 100 is attached to the motor 102 in the manner described above. The pedestal 138 enhances the conduction of motor frame temperature and motor vibration to the motor frame temperature sensor 120 and the vibration transducer 126. To further enhance motor frame temperature readings, the temperature sensor 120 is positioned within a notch 139 formed in the top portion of the pedestal 138 so that motor frame temperature is conducted through the pedestal 138 directly to the sensor 120.

Although not required, a preferred embodiment of the lower housing 110a incorporates a plurality of braces 166a–f to add structural integrity between protruding engagement surface 116 and the remaining portion of the closed end of the lower housing 110a. Another optional element formed in the lower housing 110a is a flat 180 which can be used to support a conduit when it is desired to supply the monitor 100 with external power, external sensor inputs, or any other electrical signal input. When use of an external conduit is desired, a section 182 of the flat is removed to provide support for the conduit. As can be seen, flat 180 is thicker than all other portions of the lower housing wall to ensure ample structural support for the conduit.

Figure 11:
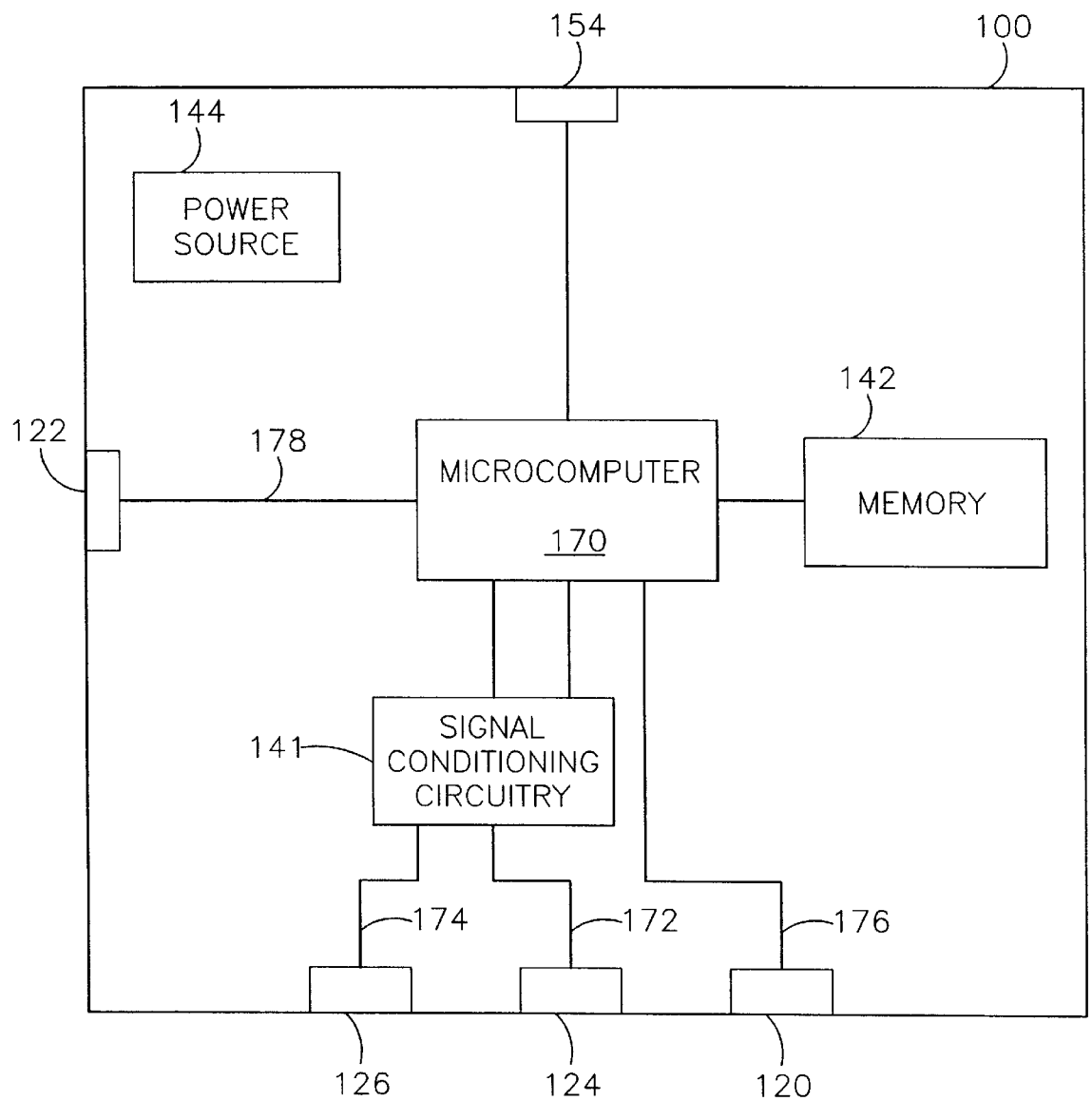
FIG. 11 is a functional block diagram of a monitor according to the invention.

As FIGS. 9 and 10 illustrate, and with further reference to the functional block diagram of FIG. 11, two electronics boards 128, 130 support the majority of the electronics contained within the chamber 131. As described above, sensors within the chamber 131 include a flux board 124, a motor frame temperature sensor 120, and a vibration transducer 126. Electronics board 128, being closest to the battery 144, is preferably configured to provide the electrical power conversion, power distribution, and power savings functions required by the monitor 100. Electronics board 130, being closest to the pedestal 138 and the motor 102, is preferably configured to support the motor frame temperature sensor 120 and the vibration transducer 126 and to process all sensor outputs. When the monitor 100 is attached to the motor 102, the sensors establish sensory contact with the motor 102 through the engagement surface 116 and/or stud 117, and through pedestal 138 and through annular sensor surface 111 so that temperature, flux, and vibrations produced by the motor 102 can be readily detected.

A communications port 154 is provided in the upper housing 110b to enable electronic communication between the monitor 100 and a peripheral device such as a CSI™ 2115 or 2120 data collector. Alternatively, communications port 154 is located in the lower housing 110a. In a preferred embodiment, communications port 155 is a serial IR data link which is protected by an IR transmissible window 155.

To secure the electronics boards 128, 130 within the chamber 131, board 128 is positioned on a circumferential shelf 136 formed along the inner surface of the lower housing 110a, and board 130 is similarly positioned on circumferential shelf 137 and the top surface of pedestal 138. The shelves 136, 137 inhibit movement of the boards 128, 130 in one direction. To inhibit movement of the boards 128, 130 in a second direction, a pair of spacer rods 140a, 140b are inserted through board 130 and threaded into corresponding threaded recesses 143a, 143b located in the pedestal 138 to secure board 130 in place as shown in FIG. 9. Board 128 is secured in place by a pair of threaded screws 145a, 145b which are inserted through the board 128 and threaded into recesses formed in the ends of rods 140a, 140b as shown. In an alternate embodiment shown in FIG. 10, a single spacer rod 146 and screw 147 are used to secure boards 128, 130 in place.

Figure 13:
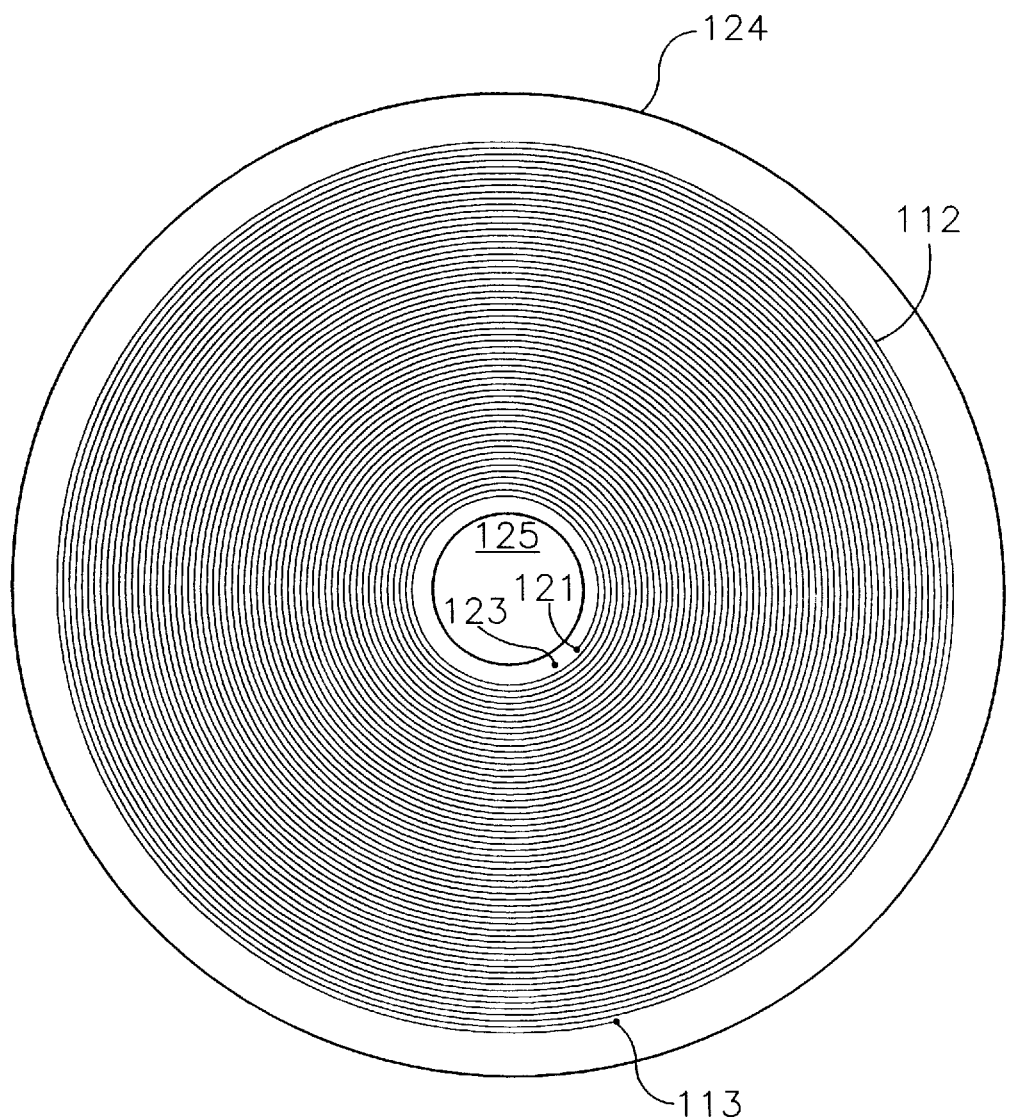
FIG. 13 is a top view of a flux board having metal traces on at least one side of the board.

Although a coil of wire may be employed as the flux sensor 124, in a preferred embodiment shown in FIGS. 13–15 flux sensor 124 is a relatively thin, substantially flat, specially designed flux board 124, or substrate, adhesively secured to the annular sensor surface 111 at the bottom of the lower housing 110a. A continuous, electrically conductive trace 112 beginning at point 121 and ending at point 113 is deposited onto the board 124, preferably in a circular spiral pattern as shown, to serve as the flux sensing element. In a preferred embodiment, the board 124 is made of a fiberglass material similar to that used in printed circuit boards. However, other nonconductive substrate materials, such as plastic, can also be effectively employed. The trace 112 is preferably made from tin-plated copper or other similar electrically conductive material.

To enhance the sensitivity of the flux board 124, a tight spiraling trace pattern, similar to the etched spiral pattern used on phonograph records, is preferably employed. Other geometric spiral patterns which can be employed include elliptical spirals, triangular, rectangular, octagonal, and other multi-sided geometric spirals.

Generally, each complete revolution of the circular spiraling trace 112 shown in FIG. 13 will sense some amount of flux when placed in a magnetic field, and the larger the radius of a particular revolution, the greater will be the amount of flux sensed. Since the amount of flux sensed by all revolutions of the continuous, spiraling trace pattern is cumulative, it is preferable in the interest of enhancing the board's sensitivity to maximize the number of turns within the pattern. The total number of turns achievable will largely depend on the available surface area of the board 124 as well as the technology available for depositing the trace 112. Prototypes fabricated from a three-inch diameter board 24 with a tin-plated, copper trace 112 of 60 turns per side have exhibited excellent flux sensing characteristics.

Another method employed in the present invention to enhance the flux sensing, capability of the flux board 124 is to penetrate the board 124 (or otherwise transition from one side to the other) with the trace 112. The spiral is then continued from the penetration point 113 in the same direction on the opposite side of the board 124, forming trace 118, so that the net effect of flux sensed by portions of the trace 112 on each side of the board 124 is cumulative instead of offsetting. Trace 118 is terminated at penetration point 123, which for convenience of lead line attachment is in close proximity to the point of origination 121 for trace 112. Accordingly, when both traces 112, 118 are employed, electrical leads are connected to points 121 and 123 to provide a flux output on line 172 (FIG. 11), and when only one trace 112 is used to sense flux, line 72 is connected at points 121 and 113.

The flux board 124, being substantially flat, is attached at the bottom of the lower housing 110a (FIGS. 9 and 10) and is completely nonobtrusive to the other elements within the monitor 100. The flux board 124 is also versatile to the point that it can be shaped and contoured to fit almost any electronics enclosure. In a preferred embodiment, the monitor 100 is round. Therefore, the flux board 124 is preferably round. To seat the flux board 124 at the bottom of the lower housing 110a, a through opening 125 is centrally located in the board 124 and in alignment with the position and shape of pedestal 138. Thus, it will be appreciated that the flux board 124 provides a highly effective, versatile, and geometrically advantageous flux sensor which can be configured as needed for each individual application.

As shown in FIG. 11, outputs from sensors 122, 124, and 126 are electrically connected to electronics board 130 where the sensor outputs are processed and stored as motor operating parameters. A power source 144, preferably in the form of two alkaline D cells connected in series or two lithium D cells connected in parallel, provide a source of dc electrical power for the monitor 100. The power source 144 is preferably secured within upper housing 110b by surrounding the battery 144 with a foam padding material. The foam padding material also assists in thermally isolating the battery 144, thereby prolonging battery life. Components which are secured to board 128 are electrically connected to the electronics board 130, as necessary, via a ribbon cable. Motor frame temperature sensor 120 is attached directly to electronics board 130.

Additional provisions are made for the attachment of a remote temperature sensor (not shown) to the electronics board 130 for measuring, for example, internal stator temperature. As previously described, flat 180 is formed in the wall of the lower housing 110a to support connection of the stator temperature sensor to the electronics board 130. The remote temperature sensor, when used, enables the user to measure internal stator temperature so that stator temperature increase can be determined from trend data.

Outputs from all sensors are processed and stored by electronics contained on the electronics board 130. As illustrated in the functional block diagram of FIG. 11, the electronics include analog signal conditioning circuitry 141 for amplifying and frequency filtering flux and vibration signals, a microcomputer 170 programmed to control the processing and storage of sensor data, and a memory 142 for storing sensor data. In an alternate embodiment, the functions provided by the signal conditioning circuitry 141 are performed by the microcomputer 170. An electrical power source 144 provides all electrical power for the monitor 100. It will be understood that, for purposes of simplifying the block diagram illustration of FIG. 11, all connections to the power source 144 are omitted.

In operation, flux board 124 senses magnetic flux produced by the motor 102 and outputs an electrical signal corresponding to sensed flux on line 172. Flux board 124 measures motor leakage flux much like an antenna. Significant information about the motor's condition can be determined from the flux signal, including running or stopped status, motor speed and load (computed from slip; i.e., the difference between the frequency of the voltage applied to the rotor and the rotor equivalent machanical frequency), and startup acceleration time. In addition, by performing a high resolution fast Fourier transform (FFT) of the flux signal, one can determine voltage phase imbalance, stator turn to turn shorts, and rotor bar condition.

Motor life factors (including motor run time, motor load and cumulative run time in various load ranges, motor starts, and the time required for a starting motor to reach operating speed) are computed from the sensor signals. In addition, several motor electrical condition indicators are measured from a high resolution flux spectrum. Voltage phase imbalance, stator condition, and rotor condition are measured as relative, trendable parameters. By obtaining a measured current spectrum for the motor at full load, a calibration and severity indication of these relative values can be determined.

Motor vibrations sensed by vibration transducer 126 are converted into a corresponding electrical signal and output on line 174. From this sensor, the monitor 100 can determine the following parameters:

1. Overall vibration;
2. Subharmonics;
3. One (1) times line frequency vibration peak (1X):
4. Two times line frequency vibration peak (2X);
5. High frequency in acceleration units;
6. 3X–8X synchronous energy;
7. 1X–8X nonsynchronous energy;
8. >8X synchronous energy; and
9. >8X nonsynchronous energy.

From this set of vibration parameters, mechanical faults are detected including imbalance, looseness, bearing degradation, oil instability in sleeve bearings, resonances, and others. The cumulative time the motor spends in each of three general vibration ranges (low, medium, and high) is also tracked.

The frame temperature sensor 120 outputs an electrical signal on line 176 corresponding to the temperature of the motor frame 104, and ambient temperature sensor 122 (when employed) outputs an electrical signal on line 178 corresponding to ambient temperature. The difference between the two temperatures is the motor heating. The microcomputer 170 receives each of the sensor signals on lines 172–178, processes and analyzes the signals, and stores the processed signals. The monitor 100 tracks ambient temperature, motor frame temperature, and motor heating as trendable parameters, as well as the cumulative amount of time motor heat resides in three temperature ranges (low, medium, and high). Temperature profile investigations of a motor's external frame 104 shows the hottest points on a motor are midway between front and back on the side or top of the motor. Typically, open frame motors show a maxinum external temperature range between 35° C. and 50° C. Totally enclosed motors typically range between 40° C. and 60° C. These temperature ranges are considered normal.

A general rule of temperature effect on motor reliability is that a long term 10° C. rise in stator temperature cuts a motor's life in half. There are many factors which can cause a motor to run hot, including:

1. Over or under voltage;
2. Frequency deviation from 60 Hz;
3. Voltage imbalance;
4. Harmonic content;
5. Altitude derating;
6. High ambient temperature (>40° C.);
7. Dirty or blocked cooling passages; and
8. Excessive load.

All of these factors result in an increase in motor heating and a significant reduction in motor life.

Data is first stored within the microcomputer's internal random access memory (RAM). Data stored in RAM is then periodically transferred to an external memory device 142, such as an electrically erasable programmable read only memory (EEPROM), for longer term storage.

From the sensor outputs, many different types and formats of motor operating parameters and information can be measured and/or calculated. For example, the cumulative run time of the motor 102 can be determined and stored for the life of the motor 102. In addition, if the user wanted to know the cumulative run time of the motor 102 for the past 30 month period, that information can be determined and stored as well. Table 1 illustrates the types and formats of parameters that are determined and stored in a preferred embodiment of the invention, where the leftmost column identifies various parameters that are measured, the middle column identifies the measurement period(s) for each parameter, and the rightmost column identifies the interval at which parametric measurements are acquired.

TABLE 1

| PARAMETER | MEASUREMENT | ACQUISITION INTERVAL |
|---|---|---|
| Motor Life Parameters | | |
| 1. Run time | 180 days, 60 months, life | 1 minute |
| 2. Starts | 180 days, 60 months, life | 1 minute |
| 3. Starting time | 180 days, 60 months, life | 1 minute |
| 4. Light load time 0–75% | 180 days, 60 months, life | 1 minute |
| 5. Rated load time 76–105% | 180 days, 60 months, life | 1 minute |
| 6. High load time >106% | 180 days, 60 months, life | 1 minute |
| 7. Low motor heating time | 180 days, 60 months, life | 1 minute |
| 8. Mid motor heating time | 180 days, 60 months, life | 1 minute |
| 9. High motor heating time | 180 days, 60 months, life | 1 minute |
| 10. Low vibration time | 180 days, 60 months, life | 1 minute |
| 11. Mid vibration time | 180 days, 60 months, life | 1 minute |

TABLE 1-continued

| PARAMETER | MEASUREMENT | ACQUISITION INTERVAL |
|---|---|---|
| 12. High vibration time | 180 days, 60 months, life | 1 minute |
| Trend Parameters | | |
| 13. Motor frame temperature | maximum, average | 1 minute |
| 14. Ambient temperature | maximum, average | 1 minute |
| 15. Motor heating (Frame-ambient) | maximum, average | 1 minute |
| 16. Motor load | maximum, average | 1 minute |
| 17. Voltage phase imbalance | maximum, average | 1 hour |
| 18. Stator condition | maximum, average | 1 hour |
| 19. Rotor condition | maximum, average | 1 hour |
| 20. Subharmonic vibration | maximum, average | 1 hour |
| 21. 1X vibration | maximum, average | 1 hour |
| 22. 2X vibration | maximum, average | 1 hour |
| 23. Harmonic vibration 3X–8X | maximum, average | 1 hour |
| 24. Harmonic vibration >8X | maximum, average | 1 hour |
| 25. Non-harmonic vibration 1X–8X | maximum, average | 1 hour |
| 26. Non-harmonic vibration >8X | maximum, average | 1 hour |
| 27. HFD | maximum, average | 1 hour |
| 28. Overall vibration | maximum, average | 1 hour |
| Maintenance Log Parameters | | |
| 29. Lubrication date/time | | As performed |
| 30. Alignment date/time | | As performed |
| 31. Bearing change date/time | | As performed |
| 32. Flux spectrum 1600 lines | Last 12 months (one/month) | 1 hour |
| 33. Vibration spectrum, 400 lines, 300 Hz | Last 52 weeks (one/week) | 1 hour |
| 34. Vibration spectrum, 800 lines, 2500 Hz | Last 12 months (one/month) | 1 hour |
| For Variable Frequency Motors | | |
| 35. RPM cumulative time <50% max rating | 180 days, 60 months, life | 1 minute |
| 36. RPM cumulative time 50–100% max rating | 180 days, 60 months, life | 1 minute |
| 37. BPM cumulative time >100% max rating | 180 days, 60 months, life | 1 minute |
| 38. RPM | maximum, average | 1 minute |

Table 1 is divided into four categories of parameters—motor life, trend, maintenance, and variable frequency motor parameters. Each parameter is measured frequently and stored in a daily and monthly buffer. The maximum and average levels for certain parameters are stored daily and kept for 180 days in a circular buffer. Each average and maximum parameter value is stored monthly in the EEPROM 142 and saved for 60 months (5 years). Some parameters are stored as the cumulative value over defined intervals, including intervals of 180 days, 60 months, and lifetime.

For example, for the motor life parameters (parameters 1–12), the cumulative value of each parameter is stored for the last 180 days, the last 60 months, and life. For trend parameters (parameters 13–28), each parameter is stored once per day for the last 180 day period and once per month for the last 60 month period.

In the circular data buffers, as new data is acquired, the oldest data in the cycle is deleted. For example, in the circular buffer for "motor frame temperature", when the data for the 61st month is acquired, it overwrites the data for the first month. Therefore, to maintain a complete historical record of this parameter, data relating to motor frame temperature should be downloaded from the monitor 100 and placed in long term electronic storage at least once every 60 months.

As Table 1 indicates, information pertaining to motor maintenance may be input and stored in the monitor 100. A record of all maintenance activity on the motor 102 can be entered through an external device, such as a CSI™ 2120 data collector, and stored in the monitor 100. Maintenance information includes the time and date of lubrication, machine alignment, and bearing replacements.

Data and information is transmitted to and from the monitor 100 through a communications port 154 (FIGS. 4 and 5), which is preferably a serial infrared (IR) data link. The upper housing 110b includes a window 155 which is fabricated from an IR transmissible material, such as a polycarbonate material, so that communications port 154 can be protected within the monitor's housing 110. Communications port 154 provides an interface for communicating with an external device, such as a portable data collector or notebook computer, via infrared data link to enable the history information to be downloaded. The portable data collector or notebook computer may also be used to program, or download programs to, the monitor 100. For the parameters given in Table 1, data would need to be downloaded at least every 180 days to avoid loss of any data. In other applications, the circular data buffers may be designed with longer or shorter circular lives. The downloaded information can be further analyzed to provide an indication of the remaining useful life of the motor 102 and to diagnose problems.

At least two options are available for collecting stored data. In one option, a portable data collector is used as a data gatherer only, with no data display capability. The data is simply moved from the monitor 100 to a base computer for analysis and archival. Another option for data collection utilizes a full Windows™ compatible pad computer running the necessary data analysis software. The pad computer should be rugged enough to analyze and display motor parametric data in the field.

In a preferred embodiment, all electrical power for the monitor 100 is provided by one or more dc batteries 144, such a replaceable, 3-volt battery 144 as previously discussed with respect to FIG. 11. Power consumption is kept to a minimum in the interest of prolonging battery life to at least two years. Microcomputer 170, which in a preferred embodiment is an 8-bit microcomputer manufactured by Toshiba, minimizes power consumption by employing a power saving sleep mode where the microcomputer 170 remains idle, or sleeps most of the time. The microcomputer 170, which includes a clock for maintaining time and date and for measuring elapsed time for certain parameters, awakes periodically, such as every 5 seconds, and checks the motor ON/OFF status. If the motor 102 is ON, the monitor 100 checks the overall amplitude measurements (load, temperature, and vibration) every 2 minutes, all measurements derived from FFT calculations once per hour, and starts per day are counted. If the motor 102 is OFF, no data is stored and the monitor 100 is set to capture the acceleration time upon start-up.

Other sources of electrical power suitable for use within the monitor 100 are available. For example, the 3-volt battery of the preferred embodiment could be replaced with a Peltier device. This type of device includes a material which, when heated on one side and cooled on the other, produces electrical power. The larger the temperature differential, the more power that the device is able to produce. The Peltier device would take advantage of motor heat to elevate the temperature of the hot side of the device, while ambient cooling would be used to reduce the temperature of the cold side. As another alternate source of power, a 120 volt power line can be connected to the monitor 100.

During operation of an electric motor 102, heat generated by the motor is typically transferred by the motor frame 104 to the ambient air, creating a heat blanket that surrounds the motor frame 104. A heat blanket may also result from external factors, such as heating induced by absorption of sunlight. Under certain conditions with some motors, this heat blanket can be large enough to adversely effect the accuracy of the ambient temperature sensor 122 and significantly reduce battery life. Heat generated by the motor 102 and external factors is also conducted from the frame 104 and surrounding ambient air to the monitor 100.

To reduce adverse effects of elevated temperature on temperature sensitive equipment, such equipment is preferably located in that area of chamber 131 which is above electronics board 128. As previously described, battery 144 is located above electronics board 128 and is surrounded by an insulative foam material to reduce battery heating. The housings 110a, 110b are also fabricated from a low thermally conductive material, which functions to shield convective heat from the internal electronics and sensors.

As discussed above, life history parameters are stored in memory 142 where they can be accessed and downloaded via communications port 154. To determine these parameters, microcomputer 170 utilizes signals generated by the sensors 120–126. Some of the sensor signals are utilized by the microcomputer 170 with little or no conditioning of the signals, while other sensor signals receive some amount of conditioning by the signal conditioning circuitry 141, including amplification and frequency filtering, before microcomputer 170 uses them. For example, to determine "run time", the output of flux board 124 may be used directly by microcomputer 170 as an indication that the motor 102 is operating. To ensure the flux signal has sufficient strength, it is first amplified and frequency filtered as needed by the signal conditioning circuitry 141 before it is received by the microcomputer 170. The microcomputer's internal clock is used to maintain a count of the total hours during which magnetic leakage flux is being generated by the motor 102. In this manner, the life history parameter of "run time" shown in Table 1 is determined. Alternatively, the outputs of frame temperature sensor 120 and accelerometer 126 may be utilized as indications of when the motor 102 is operating.

As other examples of life history parameters that are determined directly from sensor outputs, consider the parameter of "maximum motor frame temperature". To determine this parameter, microcomputer 170 compares the current frame temperature sensor output on line 176 to the previous maximum frame temperature. The stored maximum frame temperature is replaced by the current frame temperature when the current frame temperature exceeds the stored maximum. Similarly, the parameter labeled "starts" is determined directly from measured flux, or if preferred, it may be determined by monitoring temperature and vibration. When both exceed a selected threshold, a "running" condition is assumed. When either falls below its threshold, a "stopped" condition is assumed.

To determine the three "motor heating time" parameters, microcomputer 170 subtracts ambient temperature from the frame temperature to arrive at a motor heating temperature. Total motor run time at each of the low, mid, and high heating levels identified in Table 1 is then determined from the microcomputer's internal clock.

The analog output of flux board 124 is received from line 172 and amplified before being used by the microcomputer 170. As previously stated, microcomputer 170 uses a signal representative of magnetic flux produced by the motor 102 to ascertain when the motor 102 is operating. The analog output of vibration transducer 126, which represents vibration in the acceleration domain, is received by the signal conditioning circuitry 141 from line 174 where the vibration signal is preferably amplified, frequency filtered, and integrated. The conditioned vibration signal is then provided to microcomputer 170 for storage and/or analysis. Alternatively, integration of the vibration signal may be performed by the microcomputer 170.

Following an analog-to-digital conversion, the velocity domain vibration signal is used by the microcomputer 170 to determine the various vibration parameters such as those identified in Table 1. Preferably, the "maximum vibration" is the maximum vibration measured in velocity units, but alternately, velocity may be integrated to obtain vibration measured in displacement units and the maximum displacement is, in this alternate embodiment, stored as the "maximum vibration". Motor speed is determined from a high resolution FFT of the digitized vibration signal. Preferred methods of determining motor speed from vibration spectral data are disclosed in pending U.S. patent application Ser. No. 08/644,176, filed May 10, 1996, and entitled METHOD FOR DETERMINING ROTATIONAL SPEED FROM MACHINE VIBRATION DATA, the entire contents of which are expressly incorporated herein by reference. The difference between actual speed and synchronous speed at no load is used to determine motor load.

During initial installation and setup of the monitor 100, the monitor 100 is setup for the particular motor 102 on which it is installed. During this installation mode, a peripheral device such as a notebook computer or portable data collector is connected to the monitor 100 via the communications port 154 for programming, or training. Various settings and adjustments are made to the monitor 100 during setup, including full load speed, number of poles, motor identification, and others.

Once installation and training are completed, operation of the monitor 100 is completely self-contained and maintenance-free. As previously described, the monitor's internal battery 144 and electronics are configured to operate for at least two years before battery power is depleted. Data stored in the memory 142 should be periodically downloaded, at least once every six months, and analyzed to determine the health and operating condition of the motor 102. When life-extending maintenance is performed on the motor 102, that maintenance information should be input to the monitor 100.

Figure 12:
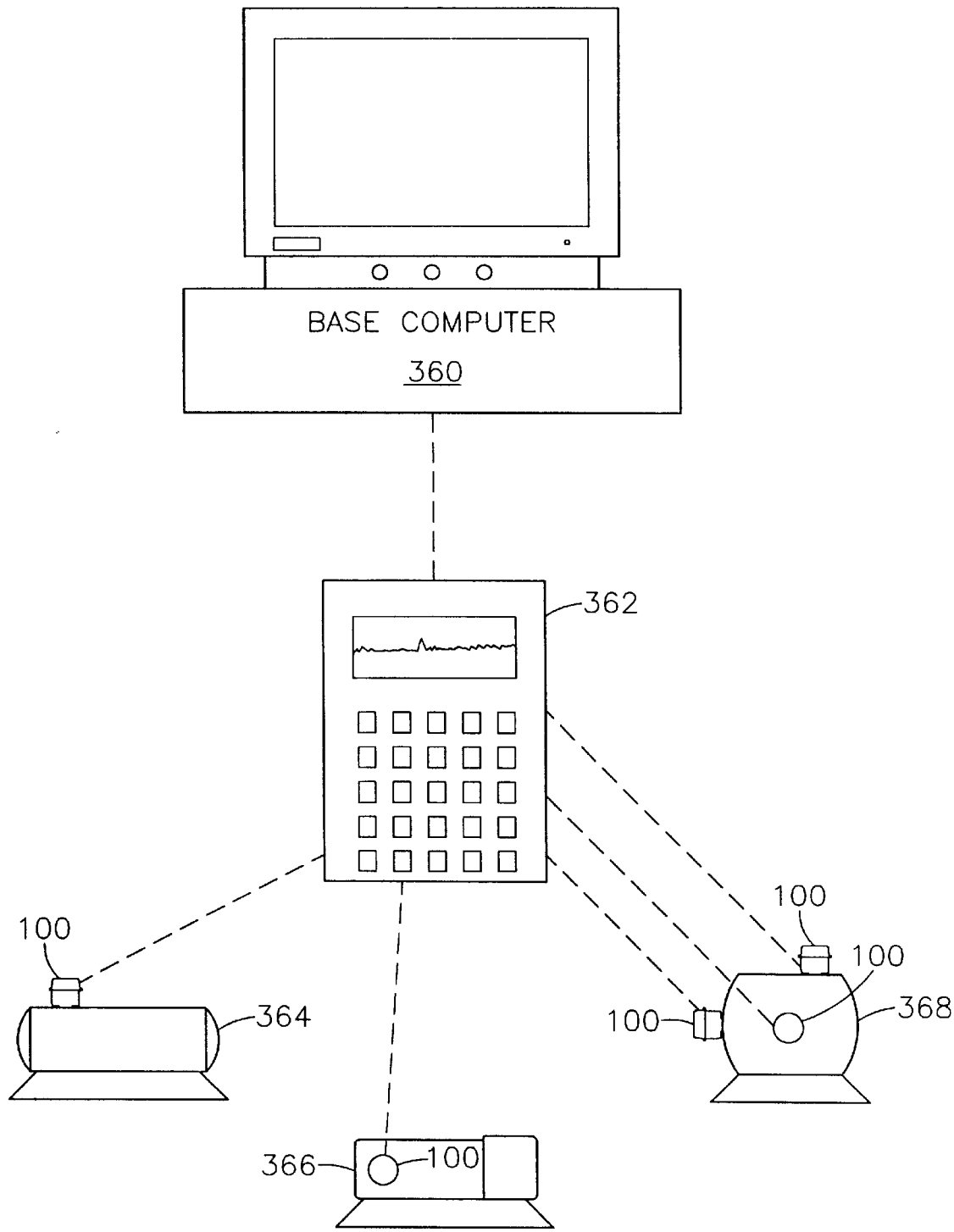
FIG. 12 is a diagrammatic drawing illustrating a monitoring system that employs a portable data collector to periodically download data stored by various monitors and transfer the downloaded data to a base computer for processing and analysis.

In a typical industrial facility, tens or even hundreds of electrical machines may exist. As FIG. 12 illustrates, the present invention provides plant personnel with a convenient system for monitoring each machine. Illustrated in FIG. 12 are three electric motors 364, 366, and 368 onto which monitors 100 have been attached. A portable data collector 362, such as a CSI™ 2120 data collector, is used to periodically download data stored in each of the monitors' memory 142. After all downloading of data is completed, the collected data is transferred to a base computer 360 for analysis and archival. Alternatively, the data collector 362 may be programmed to analyze the downloaded data on site to provide a quick determination of the operating condition of a particular motor. As described previously herein, a further function of the data collector 362 is to program, or download programs from, the monitors 100.

It is contemplated, and will be apparent to those skilled in the art from the foregoing specification, drawings, and examples that modifications and/or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. A flux detection system for monitoring flux generated by an electric machine, said system comprising:
   a structural enclosure including a sensor surface inside said enclosure for being disposed proximate to the electric machine;
   a power supply for supplying electric power to said flux detection system;
   means for attaching said enclosure to an electric machine;
   a flux board disposed in said enclosure proximate said sensor surface for sensing flux generated by said machine and producing a flux signal;
   a signal processor disposed in said enclosure for periodically receiving and processing flux signals produced by said flux board to produce operating parameters of the machine;
   a memory device disposed in said enclosure for storing said operating parameters; and
   a communications port for sending and receiving communications to and from a peripheral device, including sending at least stored parameters.

2. The system of claim 1 wherein said flux board includes:
   a nonconductive substrate having opposed first and second surfaces, said first and second surfaces being substantially planar; and
   an electrically conductive trace adjacent at least said first surface for sensing flux generated by the machine.

3. The system of claim 2 wherein said conductive trace forms a repetitive geometric pattern and is positioned in a plane which is substantially parallel with said first surface.

4. The system of claim 1 wherein said enclosure comprises:
   a first structural member having a closed end adjacent said machine and an open end;
   a second structural member adjacent the open end of said first structural member and having a dimension at least as great as a corresponding dimension of said open end so that when said second structural member is positioned adjacent the open end of said first structural member, the open end of the first structural member is closed; and
   means for securing the first structural member to the open end of said second structural member.

5. The system of claim 4, further comprising a gasket positioned between said first and second structural members to inhibit the intrusion of contaminants, including moisture, into said enclosure.

6. The system of claim 4 wherein said means for securing comprises means for interlocking said first and second structural members.

7. The system of claim 4 wherein said means for securing comprises an adhesive applied between the first and second structural members.

8. The system of claim 4 wherein said means for securing comprises at least one clamp.

9. The system of claim 1 wherein said communications port comprises an infrared data port.

10. The system of claim 1 wherein said signal processor includes means for performing a fast Fourier transform on said flux signal to produce operating parameters in the form of flux spectra.

11. A flux detection system for monitoring flux generated by an electric machine, said system comprising:
   a structural enclosure having;
      a first structural member having a closed end adjacent said machine, an annular sensor surface inside said enclosure and proximate said machine, and an open end;
      a second structural member adjacent the open end of said first structural member and having a dimension at least as great as a corresponding dimension of said open end so that when said second structural member is positioned adjacent the open end of said first structural member, the open end of the first structural member is closed; and
      means for securing the first structural member to the open end of said second structural member;
   a power supply for supplying electric power to said flux detection system;
   means for attaching said enclosure to an electric machine;
   an annular flux board disposed in said enclosure proximate to said annular sensor surface for sensing flux generated by said machine and producing a flux signal, said flux board including;
      a nonconductive substrate having opposed first and second surfaces, said first and second surfaces being substantially planar; and
      an electrically conductive trace adjacent at least said first surface and proximate said annular sensor surface for sensing flux generated by the machine;
   a signal processor disposed in said enclosure for periodically receiving and processing flux signals produced by said flux board to produce operating parameters of the machine;
   a memory device disposed in said enclosure for storing said operating parameters; and
   a communications port for sending and receiving communications to and from a peripheral device, including sending at least stored parameters.

12. A flux detector for sensing flux generated by an electric machine, said detector comprising:
   a nonconductive substrate having opposed first and second surfaces, said first and second surfaces being substantially flat and substantially parallel to each other, defining a width of said substrate therebetween, said substrate including a through opening originating at said first surface and traversing the width of the substrate to said second surface; and
   an electrically conductive trace adjacent at least said first surface for sensing flux generated by an electric machine, said conductive trace forming a substantially repetitive geometric pattern and being positioned in a plane which is substantially parallel to said first surface.

13. The detector of claim 12 wherein said geometric pattern is a continuous circular spiral.

14. The detector of claim 12 wherein said geometric pattern is a continuous rectangular spiral.

15. The detector of claim 12 wherein said trace transitions from the first surface, through the width of said substrate, and to the second surface to form a repetitive geometric pattern on the second surface.

16. The detector of claim 12 wherein said trace is comprised of a tin-plated, copper material.

17. The detector of claim 12 wherein said substrate is comprised of a fiberglass material.

* * * * *

UNITED STATES PATENT AND TRADEMARK OFFICE
CERTIFICATE OF CORRECTION

Patent No  :   5,841,255

Dated      :   November 24, 1998

Inventor(s) :   Ronald G. Canada, et al.

It is certified that error appears in the above-identified patent and that said Letters Patent hereby corrected as shown below:

At Column 3, line 6, before "can", insert --members--.

At Column 3, line 27, after "invention", insert --will now be discussed in the following detailed description and appended claims considered in--.

At Column 9, line 28, delete "machanical", and insert --mechanical--.

At Column 11, line 41, delete "BPM", and insert --RPM--.

Signed and Sealed this

Twenty-fourth Day of August, 199

*Attest:*

Q. TODD DICKINSON